(12) United States Patent
Goldberg et al.

(10) Patent No.: US 6,573,997 B1
(45) Date of Patent: *Jun. 3, 2003

(54) HYBRID SHEARING AND PHASE-SHIFTING POINT DIFFRACTION INTERFEROMETER

(75) Inventors: Kenneth Alan Goldberg, Berkeley, CA (US); Patrick P. Naulleau, Oakland, CA (US)

(73) Assignee: The Regents of California, Oakland, CA (US)

( * ) Notice: Subject to any disclaimer, the term of this patent is extended or adjusted under 35 U.S.C. 154(b) by 215 days.

This patent is subject to a terminal disclaimer.

(21) Appl. No.: 09/617,719

(22) Filed: Jul. 17, 2000

(51) Int. Cl.[7] .................................................. G01B 9/02
(52) U.S. Cl. ........................................ 356/521; 356/515
(58) Field of Search .................................. 356/521, 515

(56) References Cited

U.S. PATENT DOCUMENTS

| | | | | |
|---|---|---|---|---|
| 3,829,219 A | * | 8/1974 | Wyant | 356/489 |
| 4,604,739 A | | 8/1986 | Cohen | |
| 5,270,792 A | | 12/1993 | Snyder | |
| 5,298,971 A | | 3/1994 | Huang et al. | |
| 5,446,710 A | | 8/1995 | Gardner et al. | |
| 5,835,217 A | * | 11/1998 | Medecki | 356/521 |
| 6,111,646 A | * | 8/2000 | Naulleau et al. | 356/494 |
| 6,307,635 B1 | * | 10/2001 | Goldberg | 356/521 |

* cited by examiner

Primary Examiner—Samuel A. Turner
Assistant Examiner—Patrick Connolly

(74) Attorney, Agent, or Firm—Fliesler, Dubb, Meyer & Lovejoy LLP

(57) ABSTRACT

A new interferometry configuration combines the strengths of two existing interferometry methods, improving the quality and extending the dynamic range of both. On the same patterned mask, placed near the image-plane of an optical system under test, patterns for phase-shifting point diffraction interferometry and lateral shearing interferometry coexist. The former giving verifiable high accuracy for the measurement of nearly diffraction-limited optical systems. The latter enabling the measurement of optical systems with more than one wave of aberration in the system wavefront. The interferometry configuration is a hybrid shearing and point diffraction interferometer system for testing an optical element that is positioned along an optical path including: a source of electromagnetic energy in the optical path; a first beam splitter that is secured to a device that includes means for maneuvering the first beam splitter in a first position wherein the first beam splitter is in the optical path dividing light from the source into a reference beam and a test beam and in a second position wherein the first beam splitter is outside the optical path: a hybrid mask which includes a first section that defines a test window and at least one reference pinhole and a second section that defines a second beam splitter wherein the hybrid mask is secured to a device that includes means for maneuvering either the first section or the second section into the optical path positioned in an image plane that is created by the optical element, with the proviso that the first section of the hybrid mask is positioned in the optical path when first beam splitter is positioned in the optical path; and a detector positioned after the hybrid mask along the optical path.

20 Claims, 2 Drawing Sheets

HYBRID SHEARING AND PHASE-SHIFTING POINT DIFFRACTION INTERFEROMETER

The U.S. Government has certain rights in this invention pursuant to Contract No. DE-AC03-76SF00098 between the United States Department of Energy and the University of California for the operation of the Lawrence Berkeley National Laboratory.

BACKGROUND OF THE INVENTION

1. Field of the Invention

The present invention relates to techniques for measuring optical systems offering both high dynamic range and verifiable high-accuracy.

2. State of the Art

Optical metrology is the study of optical measurements. An area of optical metrology relevant to the present invention is the use of an interferometer to measure the quality of an optical system, such as a mirror or a lens.

One important recent application of optical metrology is the testing of projection optics for photolithography systems. Modern photolithography systems used to fabricate integrated circuits must continually image smaller features. To do so, systems are confronted with the diffraction limit of the light employed to image a pattern provided in a reticle. To meet this challenge, photolithographic systems must employ successively shorter wavelengths. Over the history of integrated circuit fabrication technology, photolithography systems have moved from visible to ultraviolet and may eventually move to x-ray radiation.

Because of the increasing difficulties posed by directly imaging a reticle pattern onto a wafer, it is desirable to use projection optics in lithography systems. Such systems include lenses or other optical elements that reduce the reticle images and project them onto the wafer surface. This allows reticles to retain larger feature sizes, thus reducing the expense of generating the reticle itself.

As with all optical imaging systems, various aberrations such as spherical aberration, astigmatism, and coma may be present. These aberrations must be identified during the fabrication and/or testing of the projection optics, or the projection optics would introduce substantial blurring in the image projected onto the wafer.

In order to test the projection optics for various aberrations, interferometers may be employed. Conventional interferometers, based upon the Michelson design for example, employ a single coherent light source (at an object plane) which is split into a test wave and a reference wave. The test wave passes through the optic under test and the reference wave avoids that optic. The test and reference waves are recombined to generate an interference pattern or interferogram. Analysis of the interferogram and the resultant wavefront can reveal the presence of aberrations.

The reference wave of the interferometer should be "perfect"; that is, it should be simple and well characterized, such as a plane or spherical wave. Unfortunately, beam splitters and other optics through which the reference wave passes introduce some deviations from perfection. Thus, the interferogram never solely represents the condition of the test optic. It always contains some artifacts from the optical system through which the reference wave passes. While these artifacts, in theory, can be separated from the measured aberrations, it is usually impossible to know that a subtraction produces a truly clean result.

To address this problem, "point diffraction interferometers" have been developed. An example of a point diffraction interferometer is the phase-shifting point diffraction interferometer (PS/PDI) described in the article H. Medecki et al., "Phase-Shifting Point Diffraction Interferometer", Optics Letters, 21(19), 1526–28 (1996), and in the U.S. Pat. No. 5,835,217 "Phase-Shifting Point Diffraction Interferometer", Inventor Hector Medecki, which are both incorporated herein by reference. Referring to FIG. 3, in this prior art phase-shifting point diffraction interferometer 2 a focused illumination source 4 is spatially filtered using a pinhole 6 placed in the object plane of the optical system 8 (hereafter called optic) under test. The pinhole diffracts a spherical illuminating wavefront that is focused in the image-plane of the test optic. A coarse grating beamsplitter 10 (e.g. a transmission grating) placed either before or following the test optic divides the beam into multiple overlapping diffraction orders. The series of diffracted orders each containing the aberrations of the optical system, are focused in the vicinity of the image-plane with a small lateral separation. The separation is determined by the wavelength, and the grating's pitch and position. A patterned opaque and transparent mask, called the PS/PDI mask 12, is placed in the image-plane where it allows only two of the orders to be transmitted. One of those beams, called the test beam, is selected to pass through a relatively large window and propagate on to reach a detector 14 placed significantly beyond the image plane. A second beam, called the reference beam, is spatially filtered by a pinhole, called the reference pinhole, in the PS/PDI mask. Via pinhole diffraction, the spatially filtered reference beam, becomes a spherical reference. The reference beam combines with the unfiltered test beam creating a pattern of light and dark fringes (an interferogram) that reveals the aberrations in the test optic. Although the PS/PDI has been proven to have high-accuracy, broad applicability of the device is severely limited by its small dynamic range.

In contrast to the PS/PDI, lateral shearing interferometry (LSI) is a well-known and reliable method of optics testing that is characterized by a larger dynamic range. The LSI 20 shown in FIG. 4 requires one less optical component than the PS/PDI but operates in nearly the same geometry. An incident focused beam 24 is spatially filtered in the object plane by a pinhole in object mask 26, thus illuminating the test optic 28 with a spherical wave. A grating beamsplitter 30 is placed near the image-plane, where the illuminating beam is focused. The diffracted orders propagate unfiltered to the detector where they overlap. While the central zeroth-order propagates to the detector in the same manner as it would if the grating were not present, the diffracted orders propagate with an angular shear, leading to a (typically) small lateral displacement at the detector 34. In this way, the test beam is compared with multiple sheared copies of itself. Analysis of the resultant interference pattern reveals an approximation to the gradient of the test wavefront, or the derivative in the direction of the shear. The original wavefront can be recovered by combining gradients from two (or more) directions. While the LSI has simplified geometry and operation relative to the PS/PDI, analysis of the PS/PDI data is more straightforward.

One primary difficulty encountered in the operation of the PS/PDI is alignment. For EUV optical systems with resolution on the order of 100 nm, the alignment of the focused beam onto the similarly sized reference pinhole poses a significant challenge. The alignment can be judged based on the visibility or contrast of the observed interference pattern: peak contrast indicates optimal alignment and will yield maximum signal-to-noise ratio in the measurement. With the test beam passing through a relatively large window (compared to the size of the focused beam), the fine alignment mainly affects the reference beam; its intensity rises and falls as its position on the reference pinhole changes.

For a similar reason, the quality (aberration magnitude) of the test optic also affects the achievable fringe contrast. When aberrations limit an optics ability to form a small focused beam, the light intensity transmitted through the reference pinhole suffers. With only about one-wave of rms aberration magnitude (wavefront error), the focused intensity can drop low enough to make interferogram analysis very difficult if not impossible. Furthermore, the alignment becomes significantly more difficult to perform. In this way, we say the dynamic range of the PS/PDI is limited. Its useful measurement range includes only optical systems in nearly perfect alignment.

In contrast to the PS/PDI, operation of the LSI has more relaxed alignment and dynamic range requirements. A large transmission grating is placed near the image plane of the test optic. In typical operation the grating is placed far enough from focus that many (10 to 100) grating lines are illuminated. In this configuration, there is no critical lateral alignment. Nor does the measurement suffer if the test optic has more than one wave of rms aberration magnitude.

In the LSI, the lateral alignment is not critical because the grating can be very large and because it is a periodic structure. Therefore, moving it laterally by one period has no effect on the recorded image. However, there is a restriction on the longitudinal position: this restriction is dictated by what are known as the Talbot planes of the grating. The source must be placed close to or in a Talbot plane of the grating. These planes are evenly spaced and are separated by a distance $d^2/\lambda$ where d is the grating pitch (or period) and $\lambda$ is the wavelength of the light. The dynamic range of the LSI is significantly larger than that of the PS/PDI. The factors that most significantly limit the dynamic range of the shearing interferometer are a restriction on the wavefront curvature, which is similar to the Talbot condition, and a restriction on the maximum fringe density (and with it a restriction on the maximum wavefront departure from sphericity) that the CCD detector can resolve. (If there are too many fringes, or the fringe density is too high, the limited number of pixels available will not be able to resolve them.)

Data analysis in lateral shearing interferometry requires that the original wavefront be reconstructed from more than one sheared wavefront measurement. Because the shearing measurement, using a conventional one-dimensional grating, yields the slope of the wavefront in only one direction, more than one slope measurement (recorded with more than one grating orientation) is required to unambiguously reconstruct the original wavefront. Using a two-dimensional grating pattern enables two directions of wavefront shear to be recorded at once. Use of a two-dimensional grating also reduces measurement uncertainties caused by unknown longitudinal position changes between measurements performed with different gratings. For these reasons the two-dimensional grating is advantageous for LSI measurements. Phase-shifting is provided by moving the grating at an angle relative to the rulings of the grating. Phase-shifting improves the efficiency and accuracy of the system.

The difficult and unavoidable task of optical system alignment involves reducing the aberrations in an assembled optical system by adjusting the free mechanical parameters. Feedback is usually provided by some means of wavefront-measuring interferometry. In such circumstances, an essential requirement of the interferometry method or tool is that it have both high dynamic range (the ability to measure the system during early or initial phase of alignment when the aberrations are large) and high accuracy, which ensures meaningful results. At present, there is no single technique that offers both high dynamic range and verifiable high-accuracy for the measurement of EUV optical systems.

SUMMARY OF THE PRESENT INVENTION

The present invention is based in part on the recognition that lateral shearing interferometry can be incorporated in conjunction with the PD/PDI to achieve both large dynamic range and high-accuracy. The accuracy of the PS/PDI can be measured in situ, and systematic errors can be identified. This improves the accuracy of concomitant shearing measurements. This combination of the strengths of two methods is well-suited, but not limited, to the measurement of optical systems designed for the extreme ultraviolet (EUV) spectral regions (near 13-nm wavelength), where high-accuracy measurement tools with large dynamic range do not yet exist.

In one embodiment, the invention is directed to a hybrid shearing and point diffraction interferometer system for testing an optical element that is positioned along an optical path which includes:

a source of electromagnetic energy in the optical path;

a first beam splitter that is secured to a device that includes means for maneuvering the first beam splitter in a first position wherein the first beam splitter is in the optical path for dividing light from the source into a reference beam and a test beam and in a second position wherein the first beam splitter is outside the optical path;

a hybrid mask which includes a first section that defines a test window and at least one reference pinhole and a second section that defines a second beam splitter wherein the hybrid mask is secured to a device that includes means for maneuvering either the first section or the second section into the optical path positioned in an image plane that is created by the optical element; and a detector positioned after the hybrid mask along the optical path. The system is preferably configured so that the first section of the hybrid mask is positioned in the optical path when the first beam splitter is positioned in the optical path.

In operation, before or after an optical element to be tested is positioned in place in the hybrid device, the hybrid device is configured to perform lateral shearing interferometry by maneuvering the first beam splitter out of the optical path and maneuvering the first section of the hybrid mask into the optical path. Following lateral shearing interferometry, the hybrid device is reconfigured by maneuvering the first beam splitter into the optical path and maneuvering the second section of the hybrid mask comprising the second beam splitter into the optical path. Thereafter, phase-shifting point diffraction interferometry is performed.

BRIEF DESCRIPTION OF THE DRAWING

The present invention may be further understood from the following description in conjunction with the appending drawing. In the drawing.

DETAILED DESCRIPTION OF THE PREFERRED EMBODIMENT

Figure 1A:
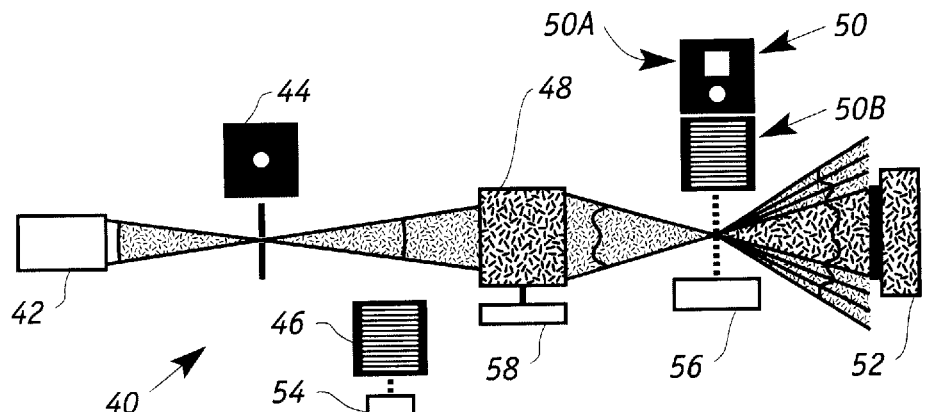
FIGS. 1A and 1B are diagrams of a hybrid-shearing and phase-shifting point diffraction interferometer.

FIG. 1A illustrates an embodiment of hybrid shearing and phase-shifting point diffraction interferometer 40 of the present invention. The hybrid device 40 includes a source of radiation 42, an object pinhole spatial-filter 44 containing a pinhole, a grating beam splitter 46 (e.g, a transmission grating) placed either before or following the test optic 48 (e.g., lens or mirror system). Here it is shown to precede the test optic 48. In addition, the hybrid device includes a hybrid shear and PS/PDI mask (hybrid mask) 50 and an irradiance detector 52 used to record the interference patterns. Examples of irradiance detectors include a camera with a photosensitive film, and a Vidicon camera; a preferred detector is a charged-couple device (CCD). As further described herein, the hybrid shearing and PS/PDI mask comprises a first section which has a test window and adjacent reference pinhole and a second section which has grating beam splitter. Only one section is used depending on the mode of operation. The spatial filter 44 is required if the spherical waver quality of the illumination is not certain.

The beam splitter 46 and hybrid shear and PS/PDI mask 50 can be mounted on motor actuated stages 54 and 56, respectively, each having suitable rotational, translational, and longitudinal controls for precise maneuvers and alignments. The test optic 48 can be similarly mounted on stage 58. As shown in FIG. 1A, the hybrid device 40 is illustrated in the mode to implement lateral shearing interferometry so that grating beam splitter 46 is retracted away from the optical path and is therefore not in use. In addition, the grating beam splitter portion 50B of the hybrid mask 50 is positioned in place and the portion 50A with the test window and reference pinhole is outside the optical path.

Figure 1B:
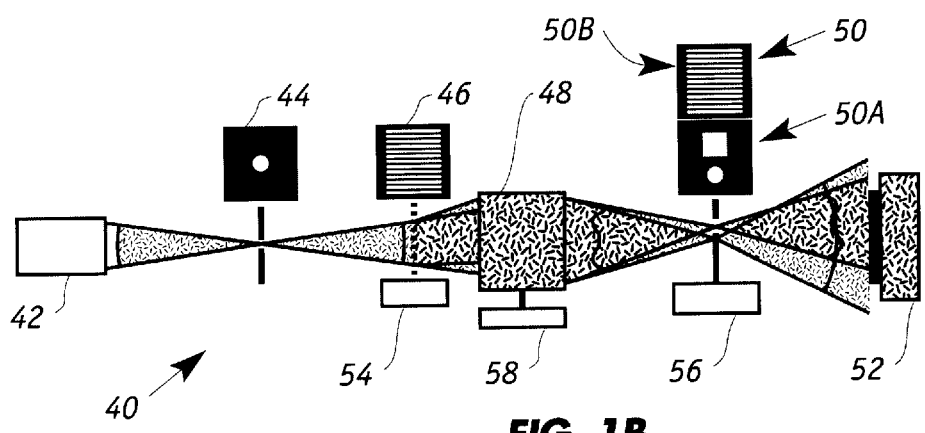

After, the test optic 48 has been tested for aberrations by lateral shearing interferometry, the hybrid device is reconfigured for phase-shifting point diffraction interferometry which is shown in FIG. 1B. In this set up, the grating beam splitter 46 is positioned in the optical path. In addition, the portion 50A of the hybrid mask 50 is positioned so that the test window and reference pinhole are in the image plane. In this configuration, the hybrid device is employed for high-accuracy measurements. When implementing the PS/PDI, a preferred method for achieving rotational and separation alignment is by control of the beam splitter. The beam splitter can, for example, be mounted on a rotation stage with translation control. In this case, the stage could be used to control the beam splitter rotational orientation which would in turn control the image point rotational orientation. The stage could also control the separation between the beam splitter and the entrance pinhole which would in turn control the image point separation. It is convenient for the stage to be controllable in situ. For certain applications such as extreme ultraviolet interferometry, where the system under test must be placed in vacuum, in situ control requires the stage motion to be in-vacuum motor actuated or manually actuated with vacuum feed-throughs.

As is apparent, positioning of the beam divider and the alignment/maneuvering of the hybrid mask can be accomplished in many ways aside from moving the beam divider or hybrid mask separately. For example, (i) moving the optic alone moves the image points relative to the mask, and (ii) moving the optic and image-plane hybrid mask as a unit moves the image points relative to the hybrid mask. In interferometers where the object-plane illumination is broad or movable, it is also possible to move the image points relative to the mask by moving the entrance pinhole. Precision stage assemblies are known in the art and are as described, for example, in U.S. Pat. Nos. 5,623,853 and 5,699,621 which are incorporated herein by reference.

Figure 2A:
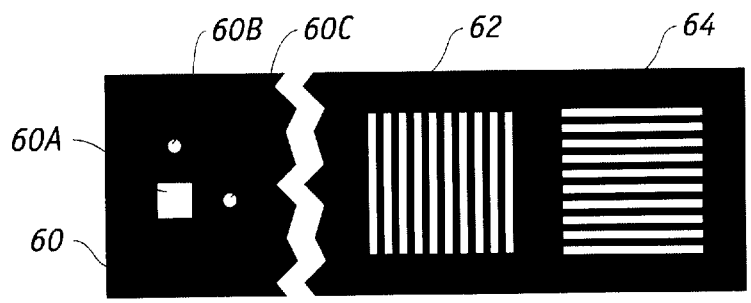
FIGS. 2A, 2B and 2C are diagrams of mask configurations for the hybrid device.

Illustrative PS/PDI and LSI "hybrid" masks described herein contain patterns that enable PS/PDI and LSI to be performed on the same optical system under test. The hybrid mask includes two sections or more that encompass: (1) the PS/PDI mask which includes typically one test beam window and at least one reference pinhole and (2) a diffraction grating. FIG. 2A is a diagram illustrating one embodiment of hybrid mask which includes a PS/PDI pattern 60 having the test beam window 60A and reference pinholes 60B and 60C. The width of the test beam window 60A is designed to be less than the test beam separation distances between the center of test beam window 60A and pinholes 60B and 60C. All of the reference pinholes are shown much larger than actual size for diagram clarity.

PS/PDI pattern 60 is shown with two different pinholes, 60B and 60C, but only one of the reference pinholes is used at a time. As described below, by using the two reference pinholes at different times, some of the systematic aberrations can be removed from the wavefront measurement. The displacement of beams in the image plane generates a large number of fringes in the interference pattern. The number and orientation of the fringes matches the portion of the grating that falls within the measurement numerical aperture and the beam separation in the image plane. However, in the absence of re-imaging optics the displacement of the two spherical beams results in a measurable, systematic, higher-ordered aberration that arises purely from the geometry, namely the path length difference between the two beams upon reaching the detector. In particular, over a circular aperture, a systemic coma aberration is present with a magnitude dependent on the numerical aperture. The angle and magnitude of the coma is proportional to the tilt, which is easily measurable by the fringe orientation and density.

When the measurement numerical aperture is precisely known, the magnitude and direction of the coma may be inferred directly from the tilt, and then subtracted from the measurement. On the other hand, when the numerical aperture is not well known, separate measurements recorded using more than one reference pinhole to filter the reference beam can be combined to separate the systemic coma from the wavefront of interest. These methods for the identification and removal of systematic error are further discussed in K. A. Goldberg, "EUV Interferometry," Doctoral Dissertation, Department of Physics, University of California, Berkeley, 1997, and K. A. Goldberg, et al., "High-accuracy interferometry of EUV lithographic optical systems," Proceedings of the EIPBN '98 Conference, Chicago, Ill., May 1998, J. Vac & Tech., B, 16 (6), 3435–3439 (1998).

The hybrid mask illustrated in FIG. 2A includes a pair of one-dimensional gratings 62 and 64 aligned at 90 degrees.

Figure 2B:
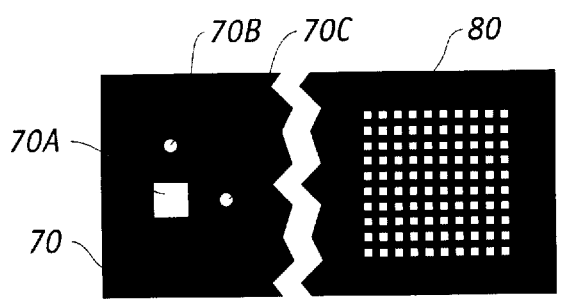

FIG. 2B is a diagram illustrating another embodiment of hybrid mask which includes a PS/PDI pattern 70 having the test beam window 70A and reference pinholes 70B and 70C. The PS/PDI pattern is essentially the same as that shown in FIG. 2A. The hybrid mask has a two-dimensional grating 80 which is, in effect, created by the superposition of two orthogonal grating patterns into a single grating.

Figure 2C:
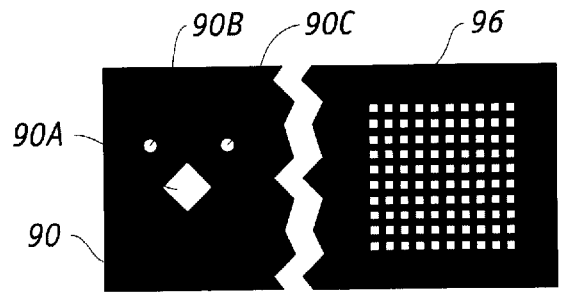
Figure 3:
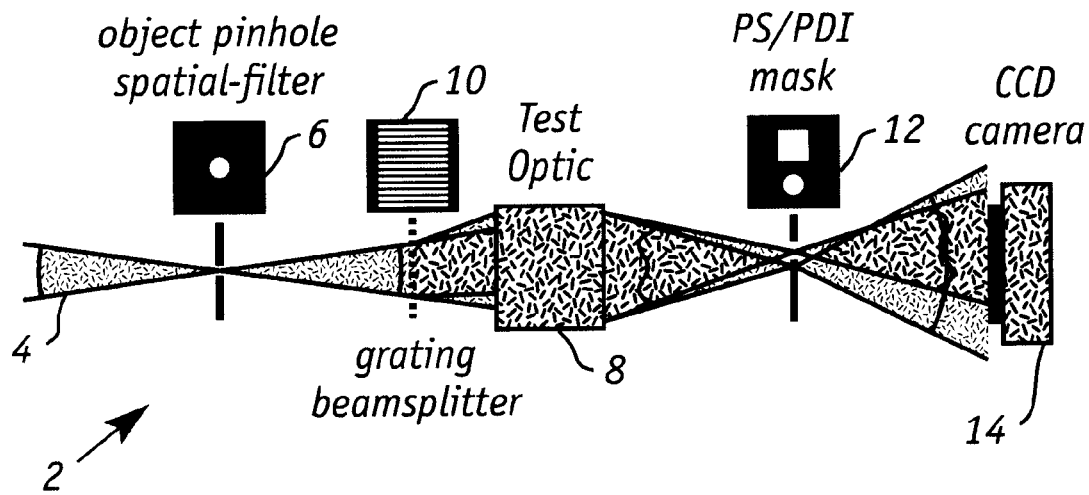
FIG. 3 is a diagram of a prior art phase-shifting point diffraction interferometer.
Figure 4:
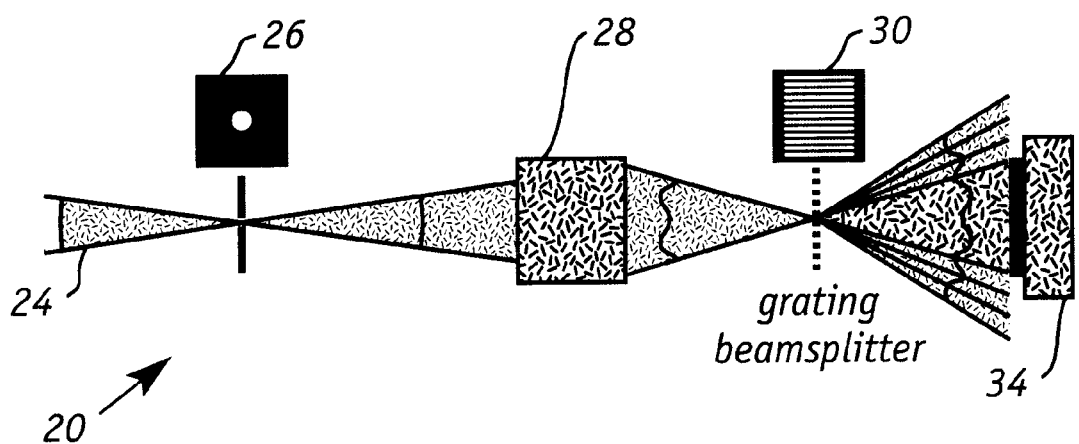
FIG. 4 is a diagram of a prior art lateral shearing interferometer.

FIG. 2C is a diagram illustrating another embodiment of hybrid mask which includes a PS/PDI pattern 90 having the test beam window 90A and reference pinholes 90B and 90C. The PS/PDI pattern is essentially the same as that shown in FIG. 2A but which is rotated 45 degrees. The hybrid mask also has a two-dimensional grating 96.

As described above, when the PS/PDI is used, a grating beamsplitter creates a series of diffracted beams which are focused in the image plane. The PS/PDI mask blocks all but two of these beams. An important consideration for the hybrid mask is that the separation between the PS/PDI mask(s) and the grating patterns) be large enough that when the PS/PDI is in use, the amount of light directed through the grating area is of negligible magnitude. Of particular concern are the unused diffraction orders of the grating beamsplitter which form a linear series of focused beams. The strengths and positions of these orders, and the desired measurement accuracy will dictate the required separation between the PS/PDI and the grating patterns.

If, as in FIG. 2C, the PS/PDI pattern is rotated by 45° (for example) and the orientation of the grating beamslitter is rotated to match, then the series of unused diffracted beams can be directed away from the adjacent grating pattern and the PS/PDI pattern can be positioned so that no overlap will occur.

The presently disclosed embodiments are therefore considered in all respects to be illustrative and not restrictive. The scope of the invention is indicated by the appended claims, rather than the foregoing description, and all changes that come within the meaning and range of equivalence thereof are intended to be embraced therein.

What is claimed is:

1. A hybrid shearing and point diffraction interferometer system for testing an optical element that is positioned along an optical path comprising:
    a source of electromagnetic energy in the optical path;
    a first beam splitter that is secured to a device that includes means for maneuvering the first beam splitter in a first position wherein the first beam splitter is in the optical path for dividing light from the source into a reference beam and a test beam and in a second position wherein the first beam splitter is outside the optical path;
    a hybrid mask which includes a first section that defines a test window and two or more reference pinholes and a second section that defines a second beam splitter wherein the hybrid mask is secured to a device that includes means for maneuvering either the first section or the second section into the optical path positioned in an image plane that is created by the optical element; and
    a detector positioned after the hybrid mask along the optical path.

2. The hybrid shearing and point diffraction interferometer system of claim 1, wherein the first beamsplitter is a diffraction grating.

3. The hybrid shearing and point diffraction interferometer system of claim 2, wherein the diffraction grating is a transmission-type diffraction grating.

4. The hybrid shearing and point diffraction interferometer system of claim 2, wherein the diffraction grating is positioned between the source and the optical element.

5. The hybrid shearing and point diffraction interferometer system of claim 1, wherein the source includes an object spatial filter that defines an input pinhole.

6. The hybrid shearing and point diffraction interferometer system of claim 1, wherein the detector comprises a charge-coupled device.

7. The hybrid shearing and point diffraction interferometer system of claim 1, wherein the hybrid mask further includes a third section that defines a third beam splitter wherein the maneuvering means moves the hybrid mask so that either the first section, the second section, or the third section of the hybrid mask is in the optical path positioned in an image plane that is created by the optical element, with the proviso that the first section is positioned in the optical path when first beam splitter is positioned in the optical path.

8. The hybrid shearing and point diffraction interferometer system of claim 1, wherein the first beam splitter is positioned on a first motorized stage and the hybrid mask is positioned on a second motorized stage.

9. The hybrid shearing and point diffraction interferometer system of claim 1, wherein the second section of the hybrid mask defines a two-dimensional grating.

10. The hybrid shearing and point diffraction interferometer system of claim 1 characterized in that the first section of the hybrid mask is positioned in the optical path when the first beam splitter is positioned in the optical path.

11. A method of testing an optical element that comprises the steps of:
    (a) providing a hybrid shearing and point diffraction interferometer system for testing an optical element that is positioned along an optical path comprising:
        a source of electromagnetic energy in the optical path;
        a first beam splitter that is secured to a device that includes means for maneuvering the first beam splitter in a first position wherein the first beam splitter is in the optical path for dividing light from the source into a reference beam and a test beam and in a second position wherein the first beam splitter is outside the optical path;
        a hybrid mask which includes a first section that defines a test window and two or more reference pinholes and a second section that defines a second beam splitter wherein the hybrid mask is secured to a device that includes means for maneuvering either the first section or the second section into the optical path positioned in an image plane that is created by the optical element, with the proviso that the first section of the hybrid mask is positioned in the optical path when first beam splitter is positioned in the optical path; and
        a detector positioned after the hybrid mask along the optical path;
    (b) positioning the optical element along the optical path before the hybrid mask;
    (c) maneuvering the first beam splitter into the second position wherein the first beam splitter is outside of the optical path;
    (d) maneuvering the hybrid mask into the second position wherein the second section of the hybrid mask comprising the second beam splitter is in the optical path;
    (e) testing the optical element employing phase-shifting point diffraction interferometry;
    (f) maneuvering the first beam splitter into the first position wherein the first beam splitter is in the optical path;
    (g) maneuvering the hybrid mask into the first position wherein the first section of the hybrid mask comprising the test window and the at least one reference pinhole is in the optical path; and
    (h) testing the optical element employing lateral shearing interferometry.

12. The method of claim 11 wherein the first beam splitter is a diffraction grating.

13. The method of claim 12, wherein the diffraction grating is a transmission-type diffraction grating.

14. The method of claim 12 wherein the diffraction grating is positioned between the source and the optical element.

15. The method of claim 11, wherein the source includes an object spatial filter that defines an input pinhole.

16. The method of claim 11, wherein the detector comprises a charge-coupled device.

17. The system of claim 11, wherein the hybrid mask further includes a third section that defines a third beam splitter wherein the maneuvering means moves the hybrid mask so that either the first section, the second section, or the third section of the hybrid mask is in the optical path positioned in an image plane that is created by the optical element, with the proviso that the first section is positioned in the optical path when first beam splitter is positioned in the optical path.

18. The method of claim 11, wherein the first beam splitter is positioned on a first motorized stage and the hybrid mask is positioned on a second motorized stage.

19. The method of claim 11, wherein the second section of the hybrid mask defines a two-dimensional grating.

20. The method of claim 11 wherein the first section of the hybrid mask is positioned in the optical path when the first beam splitter is positioned in the optical path.

* * * * *